(12) United States Patent
Asaba et al.

(10) Patent No.: US 11,901,096 B2
(45) Date of Patent: Feb. 13, 2024

(54) METHOD FOR MANUFACTURING CONNECTION BODY AND METHOD FOR CONNECTING COMPONENT

(71) Applicant: DEXERIALS CORPORATION, Tokyo (JP)

(72) Inventors: Kosuke Asaba, Tochigi (JP); Ryota Aizaki, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 533 days.

(21) Appl. No.: 17/054,387

(22) PCT Filed: Jun. 6, 2019

(86) PCT No.: PCT/JP2019/022606
§ 371 (c)(1),
(2) Date: Nov. 10, 2020

(87) PCT Pub. No.: WO2019/235589
PCT Pub. Date: Dec. 12, 2019

(65) Prior Publication Data
US 2021/0225550 A1    Jul. 22, 2021

(30) Foreign Application Priority Data

Jun. 6, 2018 (JP) ................................. 2018-109088
Jun. 6, 2019 (JP) ................................. 2019-106176

(51) Int. Cl.
*H01B 1/22* (2006.01)
*H01B 3/00* (2006.01)
(Continued)

(52) U.S. Cl.
CPC ............... *H01B 1/22* (2013.01); *H01B 3/008* (2013.01); *H01B 17/64* (2013.01); *H01R 11/01* (2013.01)

(58) Field of Classification Search
CPC .......... H01B 1/22; H01B 3/008; H01B 17/64; H01B 1/24; H01B 3/00; H01B 1/00;
(Continued)

(56) References Cited

U.S. PATENT DOCUMENTS 6,189,208 B1 * 2/2001 Estes ................. H01L 21/563
174/260
6,660,943 B1 * 12/2003 Gotoh .................. H05K 3/284
29/841
(Continued)

FOREIGN PATENT DOCUMENTS

CN 102763283 A 10/2012
CN 104342080 A 2/2015
(Continued)

OTHER PUBLICATIONS

Mar. 30, 2023 Office Action issued in Japanese Patent Application No. 2019-106176.
(Continued)

*Primary Examiner* — Angel R Estrada
(74) *Attorney, Agent, or Firm* — Oliff PLC

(57) ABSTRACT

A method for manufacturing a connection body, and a method for connecting a component, which can secure conduction reliability by trapping conductive particles even when the bump size is minimized. The method includes a disposing step of disposing a filler-containing film having a filler-aligned layer in which individual independent fillers are aligned in a binder resin layer between a first component having a first electrode and a second component having a second electrode; a temporary fixing step of pressing the first component or the second component to sandwich the filler-aligned layer; and a final compression boding step of further
(Continued)

pressing the first component or the second component after the temporary fixing step to connect the first electrode and the second electrode.

16 Claims, 4 Drawing Sheets

(51) Int. Cl.
  *H01B 17/64* (2006.01)
  *H01R 11/01* (2006.01)

(58) Field of Classification Search
  CPC ........ H01R 11/01; H01R 43/00; H01R 11/00; H05K 1/14; H05K 3/32; H01L 2224/73204; H01L 2224/83101
  USPC ... 174/137 B, 259, 260, 256, 520, 261, 262, 174/258; 361/748, 760, 779; 428/40.1, 428/143; 29/592.1, 592
  See application file for complete search history.

(56) References Cited

U.S. PATENT DOCUMENTS

| | | | | |
|---|---|---|---|---|
| 6,860,000 | B2 * | 3/2005 | Felten | H05K 1/167 |
| | | | | 174/259 |
| 8,148,641 | B2 * | 4/2012 | Tanaka | H01L 24/83 |
| | | | | 174/250 |
| 8,318,292 | B2 * | 11/2012 | Ohigashi | B32B 15/20 |
| | | | | 174/258 |
| 9,019,714 | B2 * | 4/2015 | Sato | H01L 24/83 |
| | | | | 361/748 |
| 10,350,872 | B2 * | 7/2019 | Ishimatsu | H01L 24/27 |
| 10,985,128 | B2 * | 4/2021 | Ejima | H01R 12/61 |
| 2016/0270225 | A1 | 9/2016 | Shinohara | |
| 2018/0294246 | A1 | 10/2018 | Shinohara | |
| 2020/0020664 | A1 | 1/2020 | Shinohara | |
| 2020/0299474 | A1 | 9/2020 | Tsukao | |

FOREIGN PATENT DOCUMENTS

| | | |
|---|---|---|
| JP | H06-45024 A | 2/1994 |
| JP | H09-312176 A | 12/1997 |
| JP | 2016-66573 A | 4/2016 |
| JP | 6187665 B1 | 8/2017 |
| WO | 2016/143789 A1 | 9/2016 |
| WO | WO2016/143789 A1 | 12/2017 |

OTHER PUBLICATIONS

Jun. 20, 2022 Office Action issued in Chinese Patent Application No. 201980037708.5.
Feb. 13, 2023 Office Action issued in Taiwanese Patent Application No. 108119839.
Aug. 6, 2019 Search Report issued in International Patent Application No. PCT/JP2019/022606.
Dec. 12, 2023 Request for Submission of an Opinion issued in Korean Patent Application No. 10-2020-7036602.

* cited by examiner

METHOD FOR MANUFACTURING CONNECTION BODY AND METHOD FOR CONNECTING COMPONENT

TECHNICAL FIELD

The present technology relates to a method for manufacturing a connection body, and a method for connecting a component via a filler-containing film having a filler-aligned layer in which fillers are aligned in a resin layer. This application claims priority on the basis of Japanese Patent Application No. 2018-109088 filed on Jun. 6, 2018 in Japan and Japanese Patent Application No. 2019-106176 filed on Jun. 6, 2019 in Japan, which applications are incorporated by reference herein.

BACKGROUND ART

Conventionally, a filler-containing film in which a filler is contained in a resin layer is used, and in particular, there is known a configuration in which conductive particles are used as the filler to form an anisotropic conductive film used when an electronic component such as an IC chip or a flexible substrate is mounted on a substrate.

In recent years, it has been demanded to increase the density of wiring in small electronic devices such as portable telephones and laptop personal computers, and as a method for making an anisotropic conductive film correspond to the increase in the density, there is known a technique in which conductive particles are uniformly arranged or regularly arranged in a matrix as a filler in an insulating adhesive layer of the anisotropic conductive film.

PRIOR ART REFERENCE

Patent Reference

Patent Document 1: Japanese Unexamined Patent Application Publication No. 2016-66573
Patent Document 2: Japanese Patent No. 6187665

SUMMARY OF THE INVENTION

Problem to be Solved by the Invention

Hereinafter, an anisotropic conductive film will be described as an example of the filler-containing film. For the anisotropic conductive film, the filler will be described as conductive particles. For applications other than anisotropic conductive films, conductive particles are used in the sense of fillers (aligned fillers). The trap in the anisotropic conductive film and the anisotropic conductive connection means that the filler is sandwiched between the electrodes of the electronic component and the like. In the electronic component connected by such an anisotropic conductive film, the bump size is becoming smaller in area, and when the bump size is further reduced, the number of conductive particles that can be trapped by the bump must be further reduced. Further, even in the case of an application other than the anisotropic conductive film, it is expected that only one filler, as a minimum, is required to be sandwiched (that is, trapped) in a required portion.

In the anisotropic conductive film in which the conductive particles are uniformly or regularly arranged in a matrix, it is expected that the conductive particles can be arranged even on a bump having a reduced area and the particle trapping properties can be maintained.

However, even when an anisotropic conductive film in which conductive particles are uniformly or regularly arranged in a matrix is used, there is a possibility that the adhesive component of the anisotropic conductive film flows when the connection structure is manufactured by heating and pressurizing, and as a result, the conductive particles flow out from the bump and the electrode, and the conductive particles are not trapped by the bumps. Such a problem is likely to occur as the bump size (dimensions) and area become smaller (minimized) in the future.

As described above, in the anisotropic connection of an electronic component having a minimized bump, it is required to more reliably trap conductive particles on the bump. This also applies to applications other than anisotropic conductive films. This is because the resin flow and the holding of the filler have similar potential problems.

It is an object of the present technology to provide a method for manufacturing a connection body, and a method for connecting a component, which can secure conduction reliability by trapping conductive particles even when the bump size is minimized in the case of an anisotropic conductive film or an anisotropic conductive connection. In applications other than anisotropic conductive films, it is an object of the present technology to achieve a sandwiching state of fillers aligned so as to minimize the influence of resin flow.

Means of Solving the Problem

In order to solve the above described problem, a method for manufacturing a connection body according to the present technology includes: a disposing step of disposing a filler-containing film having a filler-aligned layer in which individual independent fillers are aligned in a binder resin layer between a first component having a first connection portion and a second component having a second connection portion; a temporary fixing step of pressing the first component or the second component to sandwich the filler-aligned layer between the first connection portion and the second connection portion; and a final compression boding step of further pressing the first component or the second component after the temporary fixing step to sandwich the filler between the first connection portion and the second connection portion.

A method for connecting a component according to the present technology includes: a disposing step of disposing a filler-containing film having a filler-aligned layer in which individual independent fillers are aligned in a binder resin layer between a first component having a first connection portion and a second component having a second connection portion; a temporary fixing step of pressing the first component or the second component to sandwich the filler-aligned layer between the first connection portion and the second connection portion; and a final compression bonding step of further pressing the first component or the second component after the temporary fixing step to sandwich the filler between the first connection portion and the second connection portion.

Effects of the Invention

The present technology, when applied to an anisotropic conductive film, can sandwich the conductive particles between the first electrode and the second electrode while minimizing the flow of the conductive particles. Thus, the conductive particles are trapped in a state where the arrangement pattern close to the initial arrangement is maintained, and even when the electrode area is minimized, the conductivity between the first electrode and the second electrode can be secured. For applications other than the anisotropic conductive film, it is possible to obtain a sandwiching state of the aligned fillers (it can also be referred to as a sandwiching state of the array of fillers) that minimizes the influence of resin flow.

MODE FOR CARRYING OUT THE INVENTION

Figure 1:
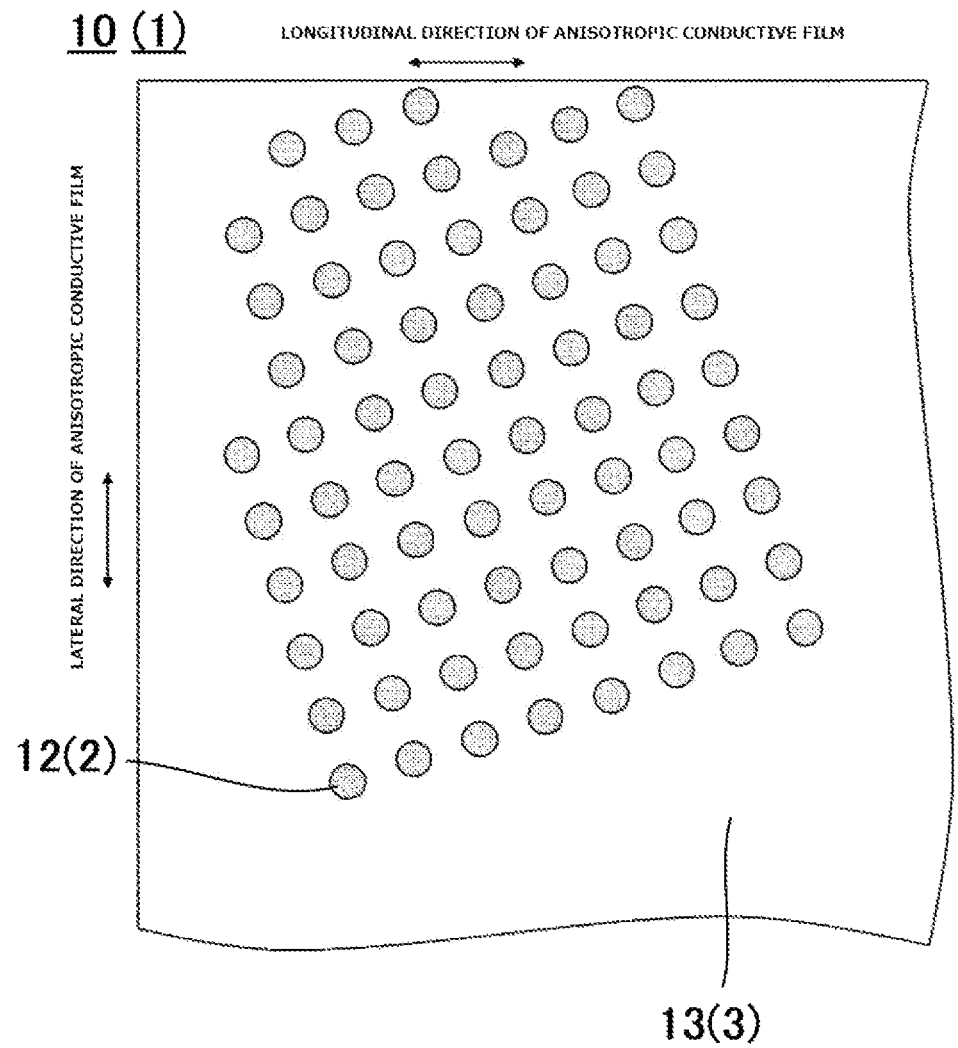
FIG. 1 is a plan view illustrating a conductive particle-aligned layer of an anisotropic conductive film shown as an example of a filler-containing film.

Hereinafter, a method for manufacturing a connection body and a method for connecting a component according to the present technology will be described in detail with reference to the drawings. It should be noted that the present disclosure is not limited to the following embodiments and various modifications can be made without departing from the scope of the present technology. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

In a connection body according to the present technology, a first component having a first electrode and a second component having a second electrode are connected through a filler-containing film having a filler-aligned layer in which independent fillers are aligned in a binder resin layer.

FIG. 1 is a plan view illustrating a filler alignment of a filler-containing film 1 according to the present technology. The filler-containing film 1 has a filler-aligned layer 3 in which fillers 2 are aligned in a resin layer, and can be constituted as an anisotropic conductive film using conductive particles as the fillers 2, or a conductive film not intended for anisotropic connection. Also, depending on the material of the filler, it can be used for purposes other than conduction or electrical conduction. Hereinafter, an anisotropic conductive film which is a suitable application example of the filler-containing film 1 will be described.

Figure 2:
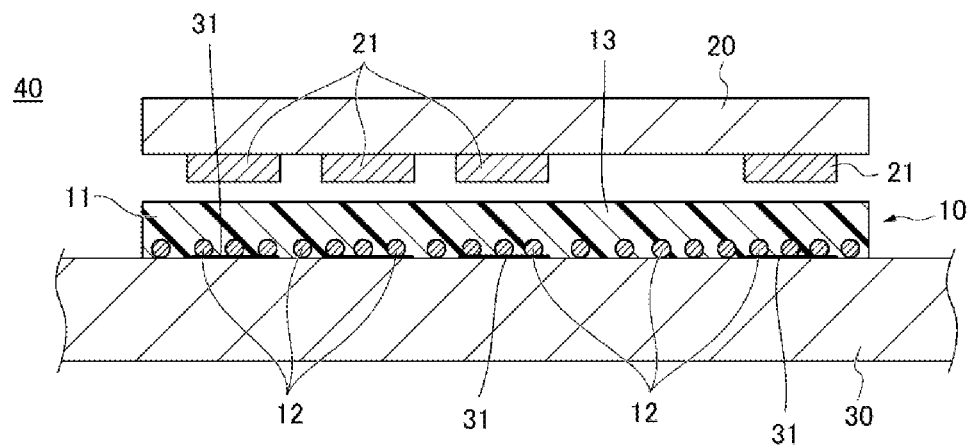
FIG. 2 is a cross-sectional view illustrating a step of temporarily pasting an anisotropic conductive film shown as an example of a filler-containing film to a second electronic component and mounting the first electronic component thereon.

As shown in FIG. 2, an anisotropic conductive film 10 can be used to anisotropically connect a first electronic component 20, such as an IC chip, which is an example of the first component, and a second electronic component 30, such as a substrate, which is an example of the second component, on which the first electronic component 20 is mounted.

The anisotropic conductive film 10 has a conductive particle-aligned layer 13 in which conductive particles 12 are individually and independently aligned in a binder resin layer 11. In the anisotropic conductive film 10, it is preferable that each independent conductive particle 12 is regularly aligned in the binder resin layer 11 in plan view. In the case where the conductive particles 12 constitute a unit by intentionally bringing the conductive particles in contact with or close to each other, the state in which the units are individually independent can be regarded as the state in which the conductive particles 12 are individually independent. In this case, the number of particles is counted by the individual conductive particles 12 constituting the unit.

Examples of the curing type (scheme of curing or polymerization reaction upon connection) of the anisotropic conductive film 10 include a thermosetting type, a photocuring type, and a curing type in combination with thermosetting and photocuring, and can be appropriately selected according to the application. Hereinafter, a thermosetting anisotropic conductive film 10 will be described as an example. The thermosetting type may be, for example, a cation-curing type, an anion-curing type, a radical-curing type (radical polymerization reactions are described in this way for convenience), or a combination thereof. There is also a hot melt type which uses a thermoplastic resin and does not utilize a curing reaction (polymerization reaction). In this case, since heat is used for the connection, it can be used similarly to the thermosetting type.

The anisotropic conductive film is not limited to any of the above curing types, and contains, as a binder resin, a film-forming resin, a curable or polymerizable resin (epoxy or polymerizable resin), and a curing reaction initiator (polymerization initiator). In addition, the anisotropic conductive film may contain an elastomer (rubber) if necessary. In the case of the hot melt type, a film-forming resin, a thermoplastic resin, and if necessary, an elastomer (rubber) may be contained. For this, known materials may be used, and examples thereof are disclosed in Japanese Unexamined Patent Application Publication No. 2014-060025.

Binder

The film-forming resin is, for example, a high-molecular-weight resin having an average molecular weight of 10,000 or more, and preferably has an average molecular weight of about 10,000 to 80,000 from the viewpoint of film formability. The film-forming resin may be a phenoxy resin, a polyester resin, a polyurethane resin, a polyester urethane resin, an acrylic resin, a polyimide resin, a butyral resin or the like, and these resins may be used alone or in combination of two or more. Among these, phenoxy resin is preferably used from the viewpoint of film formation state and connection reliability, among other factors. A specific example available in the market is "YP-50" available from Nippon Steel & Sumikin Chemical.

The epoxy resin forms a three-dimensional network structure and has excellent heat resistance and adhesiveness, and it is preferable to use both a solid epoxy resin and a liquid epoxy resin. Here, the solid epoxy resin means an epoxy resin which is solid at normal temperature. The liquid epoxy resin means an epoxy resin which is liquid at normal temperature. The normal temperature means a temperature range of 5 to 35° C. defined by JIS Z 8703.

The solid epoxy resin is not particularly limited as long as it is compatible with a liquid epoxy resin and is solid at normal temperature, and may be a bisphenol A type epoxy resin, a bisphenol F type epoxy resin, a polyfunctional epoxy resin, a dicyclopentadiene type epoxy resin, a novolak phenol type epoxy resin, a biphenyl type epoxy resin, or a naphthalene type epoxy resin, and one of which may be used alone or in combination of two or more.

The liquid epoxy resin is not particularly limited as long as it is liquid at normal temperature, and a bisphenol A type epoxy resin, a bisphenol F type epoxy resin, a novolak phenol type epoxy resin, or a naphthalene type epoxy resin can be used, and one of these can be used alone or in combination of two or more. In particular, from the viewpoint of tackiness and flexibility of the film, it is preferable to use a bisphenol A type epoxy resin. A specific example available in the market includes "EP828" available from Mitsubishi Chemical Corporation.

As the anionic polymerization initiator, known curing agents can be used. Examples include organic acid dihydrazide, dicyandiamide, amine compounds, polyamidoamine compounds, cyanate ester compounds, phenolic resins, acid anhydrides, carboxylic acids, tertiary amine compounds, imidazoles, Lewis acids, Bronsted acid salts, polymercaptan-based curing agents, urea resins, melamine resins, isocyanate compounds, and blocked isocyanate compounds, and one or more of these can be used alone or in combination. Among these, it is preferable to use a microcapsule-type latent curing agent having an imidazole-modified body as a core and its surface covered with polyurethane. A specific example available in the market is "Novacure 3941" available from Asahi Kasei E Materials.

In addition, as a binder, a silane coupling agent, a stress relieving agent, a fine filler or the like may be blended as needed. Examples of the silane coupling agent include epoxy, methacryloxy, amino, vinyl, mercapto-sulfide, and ureide. Examples of the stress relieving agent include a hydrogenated styrene-butadiene block copolymer and a hydrogenated styrene-isoprene block copolymer.

The fine fillers are mixed separately from the conductive particles 12 (filler 2) aligned therein for the purpose of imparting a function different from that of the conductive particles 12 (filler 2), such as adjusting the viscosity of the binder resin layer 11, and various fine solid materials different from that of the conductive particles 12 (filler 2) can be used. For example, when the filler 2 is the conductive particles 12, a viscosity modifier, a thixotropic agent, a polymerization initiator, a coupling agent, a flame-retardant agent or the like can be contained as the fine filler. Examples of such fillers include inorganic fillers and organic fillers. Examples of the inorganic filler include silica, alumina, talc, titanium oxide, calcium carbonate, and magnesium oxide. Examples of the organic filler include rubber particles and resin particles.

The size of the fine filler is preferably smaller than the aligned conductive particles 12 (filler 2), preferably 80% or less, more preferably 50% or less, and still more preferably 10% or less in order that the particle size does not affect the alignment. The fine fillers used as viscosity modifiers can preferably have an average particle size of less than 1 μm, more preferably 5 nm to 0.3 μm. The particle size can be determined from counting by observation with a metal microscope, an electron microscope, or the like, or from a known image type particle size distribution meter (for example, FPIA-3000 available from Malvern Instruments).

The content of the fine filler is not particularly limited as long as the pressing of the conductive particles is not inhibited in the case of producing an anisotropic conductive film by kneading the fine filler into the insulating resin layer and pressing the conductive particles into the insulating resin layer as described in the aforementioned Patent Document 2; however, from the viewpoint of ensuring the precision of the arrangement of the conductive particles, the fine filler is preferably 3 mass % or more, more preferably 5 mass % or more, and the fine filler can be contained in the binder resin layer in such a high concentration that the pressing at the anisotropic conductive connection is required in two steps. On the other hand, from the viewpoint of securing the fluidity required for the film for connecting the electronic components, the content of the fine filler is preferably 50 mass % or less, more preferably 40 mass % or less, and still more preferably 35 mass % or less with respect to the binder resin layer.

The minimum melt viscosity of the anisotropic conductive film 10 is not particularly limited as long as the conductive particles 12 (filler) can be pressed into the binder resin layer; however, in order to suppress the unnecessary flow of the conductive particles 12 when the anisotropic conductive film 10 is thermocompression-bonded to an electronic component (article), it is preferably 1,500 Pa*s or more, more preferably 2,000 Pa*s or more, and still more preferably 3,000 to 15,000 Pa*s, particularly preferably 3,000 to 10,000 Pa*s. The suitability of the minimum melt viscosity depends on the compressive deformation characteristics of the conductive particles 12, and if the minimum melt viscosity is too high, the connection resistance tends to increase since the binder between the conductive particles 12 and the electrode cannot be sufficiently removed during thermocompression-bonding. In particular, in the case of the conductive particles 12 having protrusions, it is difficult to sufficiently remove the binder between the conductive particles and the electrode during thermocompression-bonding. On the other hand, if the minimum melt viscosity is too low, the deformation of the anisotropic conductive film 10 due to the load at the time of thermocompression-bonding is increased, so that the restoring force of the anisotropic conductive film 10 is applied to the interface of the connection portion or the like as a force in the peeling direction at the time of pressure release. Therefore, the connection resistance might rise immediately after thermocompression-bonding, or air bubbles might be generated in the connection portion.

The minimum melt viscosity can be determined, for example, by a rotary rheometer (available from TA instrument), by using a measurement plate having a diameter of 8 mm and a constant measurement pressure of 5 g, and more specifically, by setting the temperature rising rate at 10° C./min, the measurement frequency at 10 Hz, and the load variation on the measurement plate at 5 g in the temperature range of 30 to 200° C. It should be noted that the minimum melt viscosity can be adjusted by, for example, changing the type and amount of fine solid materials to be blended as a melt viscosity modifier, or changing the adjustment conditions of the resin composition.

Conductive Particle

As the conductive particles 12, known conductive particles conventionally used for an anisotropic conductive film can be used, and for example, metal particles such as gold, silver, copper, nickel, cobalt, and palladium, solder particles, metal coated resin particles, those in which insulating particles are adhered to the surface of the conductive particles, those in which the surface of the conductive particles are subjected to insulating treatment, and the like can be used or used in combination. The metal coated resin particles may be subjected to an insulating treatment which does not interfere with the conduction characteristics by a known technique.

The average particle diameter of the conductive particles 12 can be appropriately determined from the viewpoints of compatibility with variations in the bump heights of the electronic component, suppressing of the increase in the conduction resistance, and prevention of the occurrence of a short-circuit between adjacent bumps, among other factors, and is, for example, 1 µm or more, preferably 2.5 µm or more, because the uniformity of sandwiching by the bump and electrode becomes difficult if the lower limit is too small. Although the upper limit is not particularly limited, it is preferably 50 µm or less, more preferably 30 µm or less, and still more preferably 20 µm or less because the variation in particle size becomes large when the particle size is too large. It should be noted that the average particle size in the case where the insulating fine particles are adhered to the surface of the conductive particles means a particle size not including the insulating fine particles adhered to the surface. The same applies to the filler 2 in the filler-containing film 1, and when there are fine particles covering the filler surface, the size of the fine particles is not included.

In particular, from the viewpoint of maintaining and improving the particle trapping properties on the bumps along with the progress of the minimization of the bump area of the electronic component in recent years, the average particle diameter is preferably 90% or less of the shortest length (diameter for circular shapes) of the surface of the bump sandwiching the conductive particles 12, more preferably 85% or less, and still more preferably 50% or less from the viewpoint of stability. For example, for a bump having a rectangular surface sandwiching the conductive particles 12 and a terminal width of 3.6 µm, the conductive particles 12 preferably have an average particle diameter of 3.2 µm (88% of the terminal width) or less, and more preferably have an average particle diameter of 3.0 µm (83% of the terminal width) or less.

In the anisotropic conductive film 10, the inter-particle distance of the conductive particles 12 can be appropriately determined according to the size, shape, and terminal pitch of terminals connected by the anisotropic conductive film 10. For example, when the anisotropic conductive film 10 is made to correspond to fine pitch COG (Chip On Glass), the distance between the closest particles is preferably 0.5 times or more of the conductive particle diameter D, and more preferably 0.7 times or more of the conductive particle diameter D from the viewpoint of preventing the occurrence of a short-circuit. On the other hand, the upper limit of the distance between the closest particles can be determined depending on the purpose of the anisotropic conductive film 10, and for example, from the viewpoint of the difficulty in manufacturing the anisotropic conductive film 10, the distance between the closest particles can be preferably 100 times or less of the conductive particle diameter D, and more preferably 50 times or less. Further, from the viewpoint of the trapping ability of the conductive particles 12 at the terminals at the time of anisotropic conductive connection, the distance between the closest particles is preferably 4 times or less of the conductive particle diameter D, and more preferably 3 times or less. In addition, in applications other than the anisotropic conductive film 10, the distance between the filers of the filler-containing film 1 can be suitably selected in accordance with the articles to be connected.

When the filler-containing film 1 is the anisotropic conductive film 10, the number density of the conductive particles 12 may be 30 particles/mm² or more, and is preferably 150 particles/mm² or more and 70,000 particles/mm² or less. Particularly, in the case of fine pitch applications, it is preferably 6,000 particles/mm² or more and 42,000 particles/mm² or less, more preferably 10,000 particles/mm² or more and 40,000 particles/mm² or less, and still more preferably 15,000 particles/mm² or more and 35,000 particles/mm² or less. When the particle diameter of the conductive particles is 10 µm or more, the number density of the conductive particles is preferably 30 particles/mm² or more and 6,000 particles/mm² or less. When the filler-containing film is used for a purpose other than an anisotropic conductive film, the number density can have a substantially similar range, and the lower limit can be 10 particles/mm² or more, preferably 30 particles/mm² or more, and the upper limit can be 100,000 particles/mm² or less, preferably 70,000 particles/mm² or less.

In the anisotropic conductive film 10 (filler-containing film 1) of the present technology, the area occupancy rate of the conductive particles 12 (filler 2) calculated by the following formula is preferably set to 0.3% or more from the viewpoint of ensuring the effect of including the conductive particles 12. On the other hand, it is preferable to set the area occupancy rate of the conductive particles 12 to 35% or less, and more preferably to 30% or less, from the viewpoint of reducing the thrust required for the pressing jig for compression-bonding the anisotropic conductive film 10 to the article.

Area occupancy rate (%)=[Number density of conductive particles 12 (filler 2) in plan view]×[Average of planar viewing area of one conductive particle 12 (filler 2)]×100

Here, as the measurement region of the number density of the conductive particles 12, it is preferable that a plurality (preferably 5 or more, more preferably 10 or more) of rectangular regions having an side of 100 µm or more are arbitrarily set to make the total area of the measurement region to be 2 mm² or more. The size and number of the individual regions may be appropriately adjusted according to the number density. For example, in a case where the number density of the anisotropic conductive film for a fine pitch application is relatively large, the number density of 200 areas of 100 µm×100 µm arbitrarily selected from the anisotropic conductive film 10 (2 mm² in total) is measured by using an image observed by a metal microscope or the like, and is averaged to determine "Number density of conductive particles 12 in plan view" in the above formula. The region having an area of 100 µm×100 µm is a region in which one or more bumps are present in a connection object having an inter-bump space of 50 µm or less. It should be noted that, in the present technology, the minimum trapping number may be small (the number of the trapped conductive particles 12 is expected to be one at minimum), and the number density of the conductive particles 12 in plan view and the area occupancy rate need not necessarily be high. In this case, the position where the conductive particles 12 are present may be appropriately adjusted by moving the anisotropic conductive film 10 itself.

The number density of the conductive particles 12, the inter-particle distance, and the like may be determined by observing the conductive particles with a metal microscope as described above, or by measuring an observation image with image analysis software (examples include WinROOF available from MITANI CORPORATION, and A zo-kun (registered trade mark) available from Asahi Kasei Engineering Corporation). The observation method and the measurement method are not limited to those described above.

The average of the planar view area of one conductive particle 12 is determined by measuring an observation image of the film surface by a metal microscope, an electron microscope such as SEM, or the like. Image analysis software may be used. The observation method and the measurement method are not limited to those described above.

The area occupancy rate can be a criterion of the thrust required for the pressing jig for compression-bonding the anisotropic conductive film 10 (filler-containing film 1) against the electronic component (article), and is preferably 35% or less, more preferably 30% or less, and the lower limit is 0.3% or more. This is due to the following reasons. That is, in the conventional anisotropic conductive film, in order to cope with a fine pitch, the distance between particles of conductive particles has been narrowed and the number density has been increased to the extent that no short-circuit is occurred. However, when the number density is increased in this way, the number of terminals of the electronic component increases and the total area of connection per electronic component increases, so that the thrust required for the pressing jig for compression-bonding the anisotropic conductive film to the electronic component increases, and there is a concern that the pressing by the conventional pressing jig becomes insufficient. The problem of the thrust required for the pressing jig is not limited to the anisotropic conductive film, but is common to the filler-containing film as a whole, and is also related to the filler as an object to be pressed and the way the filler is sandwiched. Here, by setting the area occupancy rate to preferably 35% or less, more preferably 30% or less, as described above, it is possible to reduce the thrust required for the pressing jig for compression-bonding the filler-containing film to the article.

Particle Regular Alignment

The conductive particles 12 are preferably arranged in a regular manner repeating a predetermined alignment in plan view of the film. The alignment of the conductive particles 12 may be, for example, a square lattice alignment as shown in FIG. 1 in plan view of the film. In addition, examples of the regular alignment of the conductive particles 12 includes lattice alignments such as a rectangular lattice, an orthorhombic lattice, a hexagonal lattice, and a triangular lattice, among others. The alignment of the conductive particles 12 may be a combination of a plurality of lattices of different shapes. As an example of the alignment of the conductive particles 12, particle rows in which the conductive particles 12 are linearly aligned at predetermined intervals may be aligned at predetermined intervals. Particle rows in which the conductive particles 12 are linearly arranged at predetermined intervals may be arranged in parallel at predetermined intervals. Regions where the conductive particles 12 are densely arranged and regions where the conductive particles are sparsely arranged may be regularly repeated. It is preferable that the conductive particles 12 are separated independently from each other in order to achieve both trapping stability at the terminal and short-circuit prevention. The present technology also includes an embodiment in which a plurality of conductive particles are connected or closely disposed to each other to form a unit, and the units are aligned in a regular pattern. Whether or not the conductive particles 12 are regularly aligned can be determined by, for example, observing whether or not the predetermined arrangement of the conductive particles 12 is repeated in the longitudinal direction (winding direction when used as a wound body) of the film.

When the conductive particles 12 are regularly aligned, the lattice axis or alignment axis of the alignment may be parallel to, or cross over at least one of the longitudinal direction and the direction orthogonal to the longitudinal direction of the anisotropic conductive film 10, and may be determined depending on the electronic components (article) to which the anisotropic conductive film 10 is compression-bonded.

The number of trapped particles is determined by counting the number of trapped particles even in the cases in which the particles forms a unit. In addition, if a particle can be regarded as trapped, for example, if more than half of the area of one conductive particle (filler) is overlapped with the terminal portion (connection portion) or is flattened in a plan view, the trapping may be counted as one trapping. Alternatively, if the ratio of the area overlapped with the terminal portion (connection portion) is 60%, the trapped particle may be counted as 0.6. This can be selected according to the purpose. In the case of the anisotropic conductive film 10, since the purpose is electrical conduction of the terminal portion, it is considered to be more appropriate to count the number of particles being conducted as the number of trapped particles, so the former is employed.

Alternatively, the conductive particles 12 may be removed regularly in a predetermined direction of the film. By repeatedly removing the conductive particles 12 along the longitudinal direction of the film, or by gradually increasing or decreasing the places where the conductive particles 12 do not exist in the longitudinal direction of the film, lot control becomes possible, and traceability (the ability capable of being traced) can be imparted to the anisotropic conductive film 10 and a connection body 40 using the anisotropic conductive film. This is effective for preventing forgery, determining authenticity, and preventing unauthorized use of the anisotropic conductive film 10 and the connection body using the anisotropic conductive film. This also applies to applications other than anisotropic conductive films.

By arranging the conductive particles 12 in a regular alignment such as a lattice pattern, it is possible to apply pressure evenly to each conductive particle 12 when the anisotropic conductive film 10 is compression-bonded, thereby reducing variations in the connection state.

Therefore, by arranging the conductive particles 12 in a regular pattern in plan view, the anisotropic conductive film 10 can reduce variations in conduction resistance when electronic components are connected and can improve trapping stability and prevent short-circuits between terminals.

In the anisotropic conductive film 10, the lattice axis or the alignment axis of the regularly aligned conductive particles 12 may be parallel to the longitudinal direction or the direction orthogonal to the longitudinal direction of the film, or may cross the longitudinal direction of the film, and may be determined according to the terminal width, the terminal pitch, or the like of the electronic component to be connected.

Insulating Resin Layer

Figure 3:
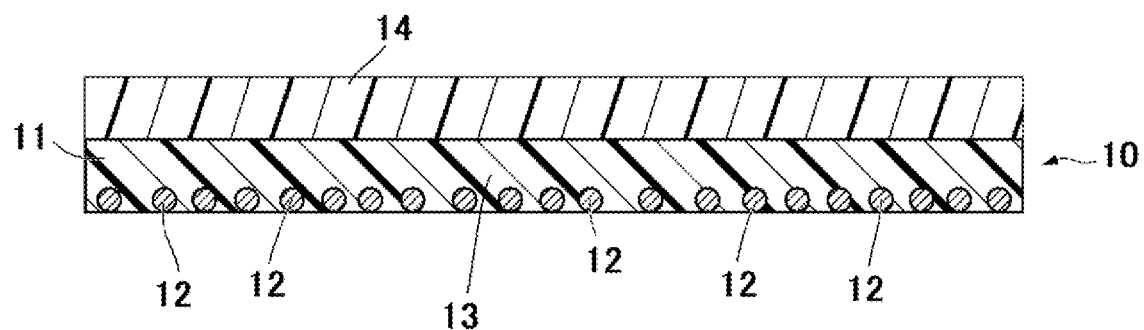
FIG. 3 is a cross-sectional view illustrating a modification of the anisotropic conductive film.

As shown in FIG. 3, in the anisotropic conductive film 10, an insulating adhesive layer 14 may be laminated on the conductive particle-aligned layer 13 in which the conductive particles 12 are regularly aligned. By laminating the insulating adhesive layer 14, the space formed by the electrode and the bump of the electronic component can be filled when the electronic component is anisotropically connected by using the anisotropic conductive film, thereby improving the adhesiveness.

As the insulating adhesive layer 14, a known material conventionally used as an insulating resin binder in an anisotropic conductive film can be used. Further, the insulating adhesive layer 14 may be the same resin as the binder resin layer 11 of the conductive particle-aligned layer 13 described above and formed by adjusting the viscosity to be lower.

The anisotropic conductive film 10 in which the conductive particle-aligned layer 13 and the insulating adhesive layer 14 are laminated is preferably pasted such that the insulating adhesive layer 14 is on the side of the first electronic component such as an IC chip which is heated and pressed by a compression bonding tool and the conductive particle-aligned layer 13 is on the side of the second electronic component such as a substrate. Thus, at the time of heating and pressing by the compression bonding tool, the influence of the pushing of a bump 21 on the flow and particle alignment of the conductive particles 12 can be suppressed, and the particle trapping properties on the terminal of the electronic component can be improved.

Film Thickness

In the filler-containing film 1 of the present technology, the thickness of the layer containing the binder resin can be appropriately selected from the viewpoints of suppressing unnecessary flow of the filler 2 when the filler-containing film 1 is thermocompression-bonded to an article, suppressing protrusion and blocking of the resin layer and increasing the film length per unit weight when the filler-containing film 1 is used as a wound body, the handling ability of the filler-containing film 1, and the adhesiveness and adhesive force necessary when the filler-containing film 1 is thermocompression-bonded to the article.

The filler-containing film 1 may be a single layer, or may have a two-layer structure in which a low-viscosity binder resin layer is laminated on a high-viscosity binder resin layer containing the filler 2 as in the anisotropic conductive film 10.

In any case, in order to stably push the filler 2, the thickness of the filler-containing film 1 (layer containing the filler) is preferably 0.3 times or more of the particle diameter of the filler 2, more preferably 0.6 times or more, still more preferably 0.8 times or more, and particularly preferably 1 time or more. Further, the upper limit of the layer thickness of the binder resin layer is not particularly limited, and the layer thickness of the binder resin layer may be appropriately adjusted according to the article to which the filler-containing film 1 is thermocompression-bonded; however, if the layer thickness of the binder resin layer is too large, the filler 2 may be easily affected unnecessarily by the resin flow when the filler-containing film 1 is thermocompression-bonded to the article, and there is a possibility that the thermocompression-bonding of the article may be inhibited due to an increase in the absolute amount of the fine solid materials contained in the binder resin layer. Therefore, the layer thickness of the binder resin layer is preferably 20 times or less, more preferably 15 times or less of the particle diameter of the filler 2.

On the other hand, when the filler-containing film 1 is a laminate of a binder resin layer in which the fillers 2 are aligned and a low-viscosity resin layer (insulating adhesive layer) in which the fillers 2 are not contained, the layer thickness of the low-viscosity resin layer may be appropriately adjusted according to the application of the filler-containing film 1; however, if it is too thin, variations in the layer thickness become relatively large, and thus the thickness is preferably 0.2 times or more, more preferably 1 time or more of the particle diameter of the fillers 2. In addition, because the excessively large thickness increases the difficulty of lamination with the binder resin layer in which the fillers 2 are aligned, the upper limit of the layer thickness of the low-viscosity resin layer is preferably 50 times or less, more preferably 15 times or less, and still more preferably 8 times or less.

When the filler-containing film 1 is a laminate of a binder resin layer in which the filler 2 is embedded and a low-viscosity resin layer (insulating adhesive layer) in which the filler 2 is not contained, from the viewpoints of suppression of unnecessary flow of the filler 2 when the filler-containing film 1 is thermocompression-bonded to an article, suppression of protrusion and blocking of the resin when the filler-containing film 1 is used as a wound body, and extension of the film length per unit weight of the filler-containing film 1, the total thickness of the resin layers in the filler-containing film 1 is preferably thin. However, if the thickness is too thin, the handling ability of the filler-containing film 1 is inferior. Further, the filler-containing film 1 might be difficult to adhere to the article, and therefore, there is a possibility that the required adhesive force cannot be obtained in the temporary compression bonding when the filler-containing film 1 is thermocompression-bonded to the article, and there is also a possibility that the required adhesive force cannot be obtained in the final compression bonding due to a shortage of the resin amount. Therefore, the total thickness of the resin layers in the filler-containing film 1 is preferably 0.6 times or more, more preferably 0.8 times or more, still more preferably 1 time or more, particularly preferably 1.2 times or more of the particle diameter of the filler 2.

Furthermore, in the case where the filler-containing film 1 is a laminate of a binder resin layer in which the filler is embedded and a low-viscosity resin layer (insulating adhesive layer) in which the filler 2 is not contained, the upper limit of the total thickness of these resin layers is not particularly limited, and may be appropriately adjusted according to the articles to which the filler-containing film 1 is thermocompression-bonded; however, if the total thickness of the resin layers is too thick, the filler 2 is likely to be unnecessarily susceptible to the effect of resin flow when the filler-containing film 1 is thermocompression-bonded to the article, and the thermocompression-bonding of the articles may be inhibited due to an increase in the absolute amount of the fine solid materials contained in the resin layer; therefore, it is considered that the influence of the resin flow on the arrangement of the filler 2 can be minimized by setting the total thickness of the resin layers to be preferably 50 times or less, more preferably 15 times or less, still more preferably 8 times or less, and still 4 times or less, preferably 3 times or less of the particle diameter of the filler 2.

When the filler-containing film 1 is formed as the anisotropic conductive film 10, and the binder resin layer 11 and the low-viscosity resin layer (insulating adhesive layer 14) are provided as the resin layers, the total thickness of the resin layers can be in the above-mentioned range. The conductive particles 12 may be embedded in the binder resin layer 11 or exposed. In particular, from the viewpoint of reducing the height of the bump in the electronic component to be connected, it is preferable to make the total thickness of the resin layer thinner than that described above. The lower limit of the total thickness of the binder resin layer 11 and the low-viscosity resin layer (insulating adhesive layer 14) is preferably 0.6 times or more, more preferably 0.8 times or more, and still more preferably 1 time or more of the conductive particle diameter. The thinner, the easier the contact between the conductive particles 12 and the conductive portion. The upper limit of the total thickness can be set to 4 times or less, preferably 3 times or less, more preferably 2 times or less, still more preferably 1.8 times or less, and particularly more preferably 1.5 times or less, because the pushing thrust becomes too high when the total thickness is too thick. The ratio of the thickness of the binder resin layer 11 to that of the low-viscosity resin layer (insulating adhesive layer 14) may be appropriately adjusted from the relation among the conductive particle diameter, the bump height, and the required adhesive force, among other factors.

In applications other than the anisotropic conductive film 10 and the conductive film, the filler 2 of the filler-containing film 1 is appropriately selected according the purpose of the filler-containing film 1 from known inorganic fillers (metal particles, metal oxide particles, metal nitride particles, and the like), organic fillers (resin particles, rubber particles, and the like), and fillers in which organic materials and inorganic materials are mixed (the conductive particles, for example, particles whose cores are formed of a resin material and whose surfaces are metal plated (metal-coated resin particle), those in which insulating fine particles are adhered to the surfaces of the conductive particles, those in which the surfaces of the conductive particles are subjected to insulating treatment, and the like) according to the performance required for the applications such as hardness and optical performance. For example, for the optical film and the matte film, silica fillers, titanium oxide fillers, styrene fillers, acrylic fillers, melamine fillers, various titanates, and the like can be used. As the film for the capacitor, titanium oxide, magnesium titanate, zinc titanate, bismuth titanate, lanthanum oxide, calcium titanate, strontium titanate, barium titanate, barium zirconate titanate, lead zirconate titanate, and mixtures thereof can be used. Adhesive films can contain polymer rubber particles, silicone rubber particles, and the like.

Method for Manufacturing Anisotropic Conductive Film

In the method for manufacturing the anisotropic conductive film 10, for example, a mold having recessed portions formed according to the alignment pattern of the conductive particles 12 is prepared, the recessed portions of the mold are filled with the conductive particles 12, and the binder resin layer 11 formed on a release film is pasted thereon to press the conductive particles 12. Thus, the anisotropic conductive film 10 provided with the conductive particle-aligned layer 13 can be formed by transferring the conductive particles 12 into the binder resin layer 11 in a predetermined pattern. The anisotropic conductive film 10 may be formed as an anisotropic conductive film having a two-layer structure by laminating the insulating adhesive layer 14 supported on a release film to the conductive particle-aligned layer 13, if necessary. The anisotropic conductive film 10 may have three or more layers by combining the conductive particle-aligned layer 13 and the insulating adhesive layer 14.

As a method for arranging the conductive particles in a predetermined alignment, a method using a biaxially oriented film or the like may be used instead of the method using the transfer mold.

Wound Body

The anisotropic conductive film is preferably implemented as a film wound body wound on a reel. By supplying the anisotropic conductive film 10 as a film wound body, the anisotropic conductive film 10 is excellent in handling ability, and anisotropic conductive connection of electronic components can be continuously performed, thereby contributing to cost reduction of the connection body.

The length of the film wound body is not particularly limited, but is preferably 5,000 m or less, more preferably, 1,000 m or less, and still more preferably 500 m or less, from the viewpoint of the handling ability of the product. In addition, although there is no particular limitation on the lower limit, it is preferable to set the lower limit to 5 m or more when considering a mass-production of the connection body.

The film wound body may be formed by connecting anisotropic conductive films shorter than the total length and connecting them with a connecting tape. The connection points may exist in a plurality of places, may exist regularly, and may exist at random. Although the width of the film is not particularly limited, it is for example 0.3 mm or more and 400 mm or less, and practically 0.5 mm or more and 5 mm or less. A value of 0.3 mm or more is considered as the limit of the slit width of the film at present, and the practical slit width is 0.5 mm or more. Further, in the case where the film is directly pasted to a relatively large electronic component (substrate having electrode wiring and mounting portion on one surface, wafer before cutting, and the like) which is wider than the slit width of a general anisotropic conductive film, for example, a film width of about 400 mm may be required.

First Electronic Component and Second Electronic Component

The filler-containing film of the present technology can be used by being pasted to an article in the same manner as the previous filler-containing film, and there is no particular limitation on the articles to be pasted. For example, when the filler-containing film is formed as the anisotropic conductive film 10 and the first electronic component 20 and the second electronic component 30 are anisotropically connected to each other by the anisotropic conductive film 10, the first and second electronic components 20 and 30 are not particularly limited, and can be appropriately selected according to the connection body. The first electronic component 20 may be, for example, a semiconductor element using a PN junction (power generating elements such as solar cells, imaging elements such as CCDs, light emitting elements, and Peltier elements), various other semiconductor elements, an IC chip, an IC module, and an FPC, among others, and the shape thereof is not particularly limited. In addition, as the first electronic component 20, a tape carrier package substrate or the like can be exemplified. The second electronic component 30 may be an FPC, a glass substrate, a plastic substrate, a rigid substrate, and a ceramic substrate, among others. The filler-containing film 1 of the present technology can also be used for electronic components other than anisotropic conductive connection applications.

The article using the filler-containing film 1 of the present technology is not limited to an electronic component. The surface to which the filler-containing film 1 (anisotropic conductive film 10) is pasted may be smooth, or may have a stepped portion or a convex shape. It is one object of the present technology to precisely sandwich the filler, and the application of the present technology is not necessarily limited to anisotropic conductive connections.

The first electronic component 20 is provided with a bump 21 serving as a protruding electrode and the second electronic component 30 is provided with a terminal electrode 31, and conduction between the bump 21 and the terminal electrode 31 is achieved through the conductive particles 12 of the anisotropic conductive film 10.

Connection Body

The anisotropic conductive film 10 is suitably used for manufacturing the connection body 40 manufactured by anisotropically connecting the first electronic component 20 and the second electronic component 30 by heat or light.

It should be noted that the anisotropic conductive film of the present technology may be used to stack IC chips and wafers to form a multilayer structure. The electronic components connected by the anisotropic conductive film 10 of the present technology are not limited to the examples of the electronic components described above. It can be used for various electronic components which have been diversified in recent years. The present technology includes a film-bonded body in which the filler-containing film 1 of the present technology is pasted to various articles, and particularly includes a connection body in which the first electronic component 20 and the second electronic component 30 are connected via the anisotropic conductive film 10.

As the method of pasting the filler-containing film 1 to the article, the filler-containing film 1 can be compression-bonded, preferably thermocompression-bonded, according to the application of the filler-containing film 1, and light irradiation may be utilized at the time of pasting.

Manufacturing Method of Connection Body

Next, a method for manufacturing a connection body according to the present technology will be described. A method for manufacturing a connection body according to the present technology includes: a disposing step (pasting step) of disposing (pasting) a filler-containing film having a filler-aligned layer in which individual independent fillers are aligned in a resin layer between a first component having a first electrode and a second component having a second electrode; a temporary fixing step of pressing the first component or the second component to sandwich the filler-aligned layer between the first electrode and the second electrode; and a final compression bonding step of further pressing the first component or the second component after the temporary fixing step to electrically connect the first electrode and the second electrode.

In the anisotropic conductive connection between the first electronic component and the second electronic component, the first electronic component is placed on a compression bonding tool side, and the second electronic component is placed on a stage facing the compression bonding tool. Further, although it is common to paste the anisotropic conductive film to the second electronic component in advance, it may be pasted to the first electronic component in advance. This can be appropriately adjusted according to the way of connection. The number of the first electronic component and the second electronic component is not limited to one to one. A plurality of first electronic components may be mounted on one second electronic component, or one first electronic component may be mounted on a plurality of second electronic components.

In the following, a method for manufacturing the connection body 40 using the anisotropic conductive film 10 as the filler-containing film, the first electronic component 20 as the first component, and the second electronic component 30 as the second component will be described.

A method for manufacturing the connection body 40 includes: a disposing step of disposing the anisotropic conductive film 10 having the conductive particle-aligned layer 13 in which independent conductive particles 12 are aligned in the binder resin layer 11 between the first electronic component having the bump 21 and the second electronic component having the terminal electrode 31; a temporary fixing step of pressing the first electronic component or the second electronic component to sandwich the conductive particle-aligned layer 13 between the bump 21 and the terminal electrode 31; and a final compression bonding step of further pressing the first electronic component or the second electronic component after the temporary fixing step to electrically connect the bump 21 and the terminal electrode 31.

In the disposing step, as shown in FIG. 2, the conductive particle-aligned layer 13 of the anisotropic conductive film 10 is arranged on the surface of the second electronic component 30 where the terminal electrode 31 is formed. When the conductive particles 12 are aligned so as to be unevenly deviated to one surface side of the binder resin layer 11, the one surface of the binder resin layer 11 to which the conductive particles 12 are unevenly deviated is disposed on the surface on which the terminal electrode 31 of the second electronic component 30 is formed. Also, when a two-layer type film having the conductive particle-aligned layer 13 and the insulating adhesive layer 14 is used as the anisotropic conductive film 10, the conductive particle-aligned layer 13 is arranged on the surface of the second electronic component 30 where the terminal electrode 31 is formed.

Figure 4:
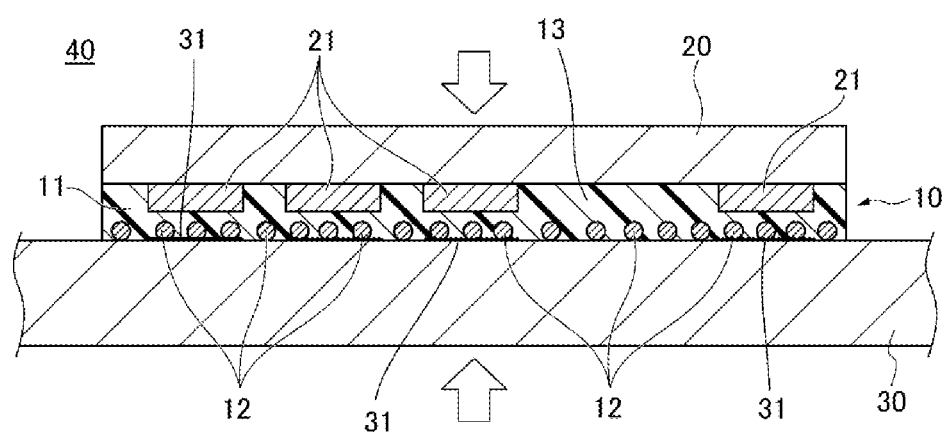
FIG. 4 is a cross-sectional view illustrating a step of temporarily fixing the first and second electronic components via the anisotropic conductive film.

Next, in the temporary fixing step, as shown in FIG. 4, the bump 21 of the first electronic component 20 is pressed into the conductive particle-aligned layer 13 by heating and pressurizing in the direction in which the first electronic component 20 faces the second electronic component 30 (arrow direction in FIG. 4). The heating temperature and pressure at this time are preferably such that the conductive particles 12 can be held without flowing out from between the bump 21 and the terminal electrode 31 while the adhesive component of the anisotropic conductive film 10 flows, and are equal to or lower than the heating temperature and pressure in the subsequent final compression bonding, respectively. That is, the temporary fixing step means pushing the bump 21 at least to the vicinity of the conductive particles. This is a state in which the electronic component is pushed more than a so-called "temporary compression bonding" which is performed after the electronic component is mounted. For example, the bump is brought into contact with the conductive particles 12 or the conductive particle-aligned layer 13 of the anisotropic conductive film 10. This is due to the following reasons.

The temporary fixing step just sandwiches the conductive particle-aligned layer 13 between the bump 21 and the terminal electrode 31, and the conductive particles 12 need not be sandwiched by the bump 21 and the terminal electrode 31. Of course, in the temporary fixing step, pressure may be applied until the conductive particles 12 are sandwiched between the bump 21 and the terminal electrode 31. This is because, when the connections of the first electronic component 20 and the second electronic component 30 are performed repeatedly, it is difficult to precisely control them every time, so that practically, they will be in a state to the extent in which the compression bonding tool comes into contact with the conductive particle-aligned layer 13 or the conductive particles 12.

In the method for manufacturing a connection body according to the present technology, a temporary fixing step is followed by the final compression bonding step. That is, the pressure applied in the temporary fixing step is not released, and the pressure of the compression bonding tool is further increased to pressurize the first electronic component 20 and the second electronic component 30 in the opposing direction, and the conductive particles 12 are sandwiched between the bump 21 and the terminal electrode 31. Further, thermocompression-bonding is performed from the first electronic component 20 side by using a compression bonding tool.

The temporary fixing step and the final compression bonding step can be performed by, for example, a pulse heater type bonder. When the anisotropic conductive film 10 is formed as a photocurable type or a curing type in combination with thermosetting and photocuring, the first and second electronic components 20 and 30 are connected by photocuring or utilizing heat and light.

Figure 5:
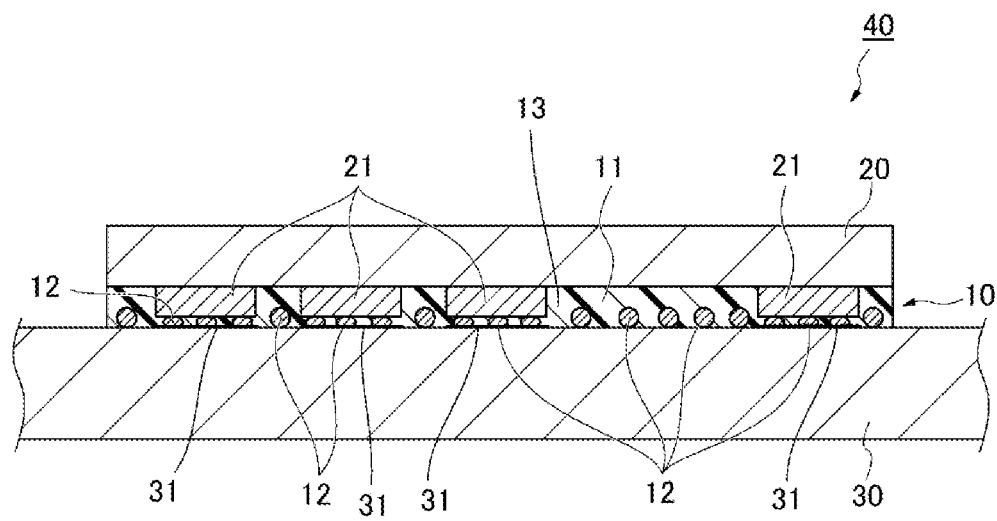
FIG. 5 is a cross-sectional view illustrating a step of completing the connection body by subjecting the first and second electronic components to final compression bonding via the anisotropic conductive film.

As a result, in the example shown in FIG. 5, the first electronic component 20 and the second electronic component 30 are electrically connected to each other, and the binder resin layer 11 heated by the compression bonding tool is cured in this state, thereby forming the connection body 40 in which the first electronic component 20 is mounted on the second electronic component 30. In the connection body 40, the conductive particles 12 not between the bump 21 and the terminal electrode 31 maintain an electrically insulated state. Thus, electrical conduction is achieved only between the bump 21 and the terminal electrode 31.

When it is difficult to temporarily paste the anisotropic conductive film 10 to the second electronic component 30 due to the size of the connection area of the second electronic component 30 such as a wiring board, the anisotropic conductive film 10 may be temporarily pasted to the bump forming surface of the first electronic component 20 such as the IC chip or the FPC, and then the first electronic component 20 and the second electronic component 30 may be connected.

With the recent downsizing of various electronic devices, the bump size and the terminal electrode size of the first and second electronic components 20 are also minimized, and for example, electronic components in which the bump area is minimized to several tens $\mu m^2$ to several thousand $\mu m^2$ have been proposed. In addition, along with the minimization of the bump area, the downsizing of the electronic component itself advances. On the contrary, in some cases, upsizing of electronic components for mounting also advances. An electronic component having a relatively large external size that can be divided into a plurality of electronic components may be mounted collectively. It may also be connected as a relatively large implementation, such as a wafer, and then diced. That is, the components used for the connection of the present technology can be applied to not only relatively small ones, but also relatively large ones. For example, in the case of using the anisotropic conductive film 10 (filler-containing film 1) for a large television monitor or the like, the anisotropic conductive film may be pasted on one side by 1 m or more, for example, 4.5 m or more. In this case, in addition to using the filler-containing film as the anisotropic conductive film, it may also be used as a spacer film or the like using the filler as a spacer.

In any case, even in such a minimized bump area, it is necessary to surely trap the conductive particles 12 and ensure conductivity. In this regard, in the manufacturing method for the connection body 40 using the anisotropic conductive film 10 according to the present technology, the conductive particles 12 which are independent from each other are aligned in plan view, and preferably aligned regularly, so that the conductive particles are surely positioned on the bump even when the bump area is minimized.

In addition, a method for manufacturing the connection body 40 according to the present technology includes a temporary fixing step of sandwiching the conductive particle-aligned layer 13 between the bump 21 and the terminal electrode 31, and a final compression bonding step of sandwiching the conductive particle-aligned layer 13 between the first electronic component 20 and the second electronic component 30 after the temporary fixing step and curing the film in a state of electrically connecting the bump 21 and the terminal electrode 31 via the conductive particles 12.

In the temporary fixing step, the binder resin of the binder resin layer 11 flows by heating and spreads between the first electronic component 20 and the second electronic component 30. The heating temperature and the pressurizing force in the temporary fixing step are lower than the heating temperature and the pressurizing force in the final compression bonding step, and the flow of the binder resin is not relatively large. Therefore, the binder resin can be removed from between the bump 21 and the terminal electrode 31 while suppressing the flow of the conductive particles 12.

When a two-layer type anisotropic conductive film 10 in which the conductive particle-aligned layer 13 and the insulating adhesive layer 14 are laminated is used, the binder resin of the insulating adhesive layer 14 flows in the temporary fixing step, and the flow of the binder resin of the conductive particle-aligned layer 13 is smaller than that of the insulating adhesive layer 14. Therefore, the binder resin can be removed from between the bump 21 and the terminal electrode 31 while suppressing the flow of the conductive particles 12.

Subsequently, by performing the following final compression bonding step without releasing the pressurizing force in the temporary fixing step, the conductive particles 12 can be sandwiched by the bump 21 and the terminal electrode 31 while minimizing the flow of the conductive particles. As a result, the conductive particles 12 are trapped by the bump 21 while maintaining the arrangement pattern close to the initial arrangement. Therefore, according to the method for manufacturing the connection body according to the present technology, even when the bump area is minimized, the conductivity between the bump 21 and the terminal electrode 31 can be secured.

As described above, in the temporary fixing step, the conductive particle-aligned layer 13 may be sandwiched by the bump 21 and the terminal electrode 31; however, this does not prevent the bump 21 from coming into contact with the conductive particles 12. When the bump 21 comes into contact with the conductive particles 12 in the temporary fixing step, the flow of the conductive particles 12 can be more reliably suppressed in the final compression bonding step.

In view of the minimization of the bump area and the collective mounting of the first electronic component 20 on a large-sized component, it is expected that a higher level of alignment accuracy for mounting the electronic component is required as compared with the prior art, and a slight displacement due to an external force applied when the first electronic component is mounted on the anisotropic conductive film 10 or is pressed against a compression bonding tool is highly likely to affect the product quality, reproducibility, and yield of the connection body. Therefore, the anisotropic conductive film 10 (filler-containing film 1) preferably has an adhesive force enabling the temporary compression bonding before the thermocompression-bonding to the article. The adhesive force of the anisotropic conductive film 10 can be measured in accordance with JIS Z 0237, or can be measured as a tack force by a probe method in accordance with JIS Z 3284-3 or ASTM D 2979-01. In either cases that the anisotropic conductive film 10 has an insulating resin layer and a low-viscosity resin layer as resin layers or has only an insulating resin layer, the tack force measured by the probe method on at least one the front and back surfaces of the anisotropic conductive film 10 can be set to 1.0 kPa (0.1 N/cm2) or more, preferably 1.5 kPa (0.15 N/cm2) or more, and more preferably 3 kPa (0.3 N/cm2) or more, as measured at a probe pressing speed of 30 mm/min, a pressing pressure of 196.25 gf, a pressing time of 1.0 sec, a peeling speed of 120 mm/min, and a measuring temperature of 23±5° C. In the measurement, the tack force of one surface of the anisotropic conductive film 10 can be measured by pasting the other surface to a plain glass plate (for example, 0.3 mm thick). In the measurement, the anisotropic conductive film 10 may be pasted to a flexible thermoplastic resin film (unprocessed PET film having a thickness of 20 µm or less, silicone rubber, and the like) instead of the plain glass plate. By inverting the bonding surface of the anisotropic conductive film 10, the tack forces of the front and back surfaces of the anisotropic conductive film 10 can be measured under the same condition.

In particular, when the anisotropic conductive film 10 has a release base material on both the front and back surfaces, it is preferable to use the front and back surfaces of the anisotropic conductive film 10 so that the surface opposite to the surface previously adhered to the electronic components exhibit the above-described tack force, and when the anisotropic conductive film 10 has a release base material on one surface thereof as in the case of the anisotropic conductive film 10 as a wound body, it is preferable that the surface on the release base material side exhibit the above-described tack force. When the anisotropic conductive film 10 has an insulating resin layer and a low-viscosity resin layer, the surface of the low-viscosity resin layer preferably has the above-described tack force. On the other hand, the surface firstly adhered to the electronic component, when the anisotropic conductive film 10 has a release base material on both the front and rear surfaces, the surface on the side without the release base material when the anisotropic conductive film 10 has a release base material on one surface thereof, and the surface on the side of insulating resin layer when the anisotropic conductive film 10 has the insulating resin layer and the low-viscosity resin layer, need not necessarily have the tack force described above, but it is desirable to have the tack force. The reason why the preferable tack force is different between the front and back surfaces of the anisotropic conductive film 10 is as follows. That is, in general, when the anisotropic conductive film is used, the surface of the anisotropic conductive film opposite to the release base material is adhered to the second electronic component such as the substrate, the release base material is peeled off, the first electronic component such as the IC chip is mounted on the surface from which the release base material is peeled off (that is, the surface of the release base material side), and the first electronic component is heated and pressed against the second electronic component mounted on the stage by the thermocompression bonding tool. In this process, it is necessary to ensure an adhesive performance capable of accurately fixing the mounted component when the first electronic component is mounted.

In the case of a small mounting component, a slight deviation will not be acceptable during mounting; however, it is presumed that a relative reduction of the adhesive force required for mounting can be acceptable with respect to a larger mounting component. Therefore, the required adhesive force may be determined according to the component to be mounted.

The adhesive force of the anisotropic conductive film 10 (filler-containing film 1) can also be determined in accordance with the adhesive strength test described in Japanese Unexamined Patent Application Publication No. 2017-48358. In this adhesive strength test, for example, by sandwiching the anisotropic conductive film 10 between two glass plates, fixing one glass plate, reinforcing the adhesive state between the fixed glass plate and the anisotropic conductive film 10, and peeling off the other glass plate at a peeling-off speed of 10 mm/min and a test temperature of 50° C., the adhesive force between the peeled-off glass plate and the surface of the anisotropic conductive film 10 bonded to the glass plate can be measured. The adhesive strength (adhesive force) measured in this way may preferably be 1 N/cm$^2$ (10 kPa) or more, more preferably 10 N/cm$^2$ (100 kPa) or more. This will be the adhesive force between the article to be peeled off and the surface of the anisotropic conductive film 10 existing in the peeling direction.

Alternatively, the adhesive force of the anisotropic conductive film 10 can be determined by a test in which one end of the test piece is aligned and bonded (pasted) and the other end is pulled up to peel the test piece. The adhesive force measured by this test method may be equivalent to the adhesive strength test described above (1 N/cm$^2$ (10 kPa) or more). If the adhesive force determined by the above-described adhesive strength test is sufficiently large (for example, 10 N/cm$^2$ (100 kPa) or more), the adhesive force determined by this test method may be 10% or more of the adhesive force determined by the above-described adhesive strength test.

Since the anisotropic conductive film 10 has the above-described adhesive force, even if the article to be thermocompression-bonded is, for example, an electronic component having a maximum dimension of less than 0.8 mm, which is smaller than a general IC chip, the problem of positional deviation in the temporary compression bonding is eliminated, and even if the electronic component has a maximum dimension of about 450 cm, which is about the same as that of a large television monitor, the bonding can be stabilized.

Such adhesiveness can be imparted by appropriately adjusting the resin composition constituting the binder resin layer and the low-viscosity resin layer.

EXAMPLES

Next, examples of the present technology will be described. It should be noted that the present technology is not limited to the examples described below. Here, a member for anisotropic conductive connection is used in order to verify the effect of the two-step connection of the present technology. In the examples, an anisotropic conductive film in which the conductive particles 12 are aligned regularly in plan view and an anisotropic conductive film in which the conductive particles 12 are dispersed in a binder resin layer are formed, and the IC chip for evaluation and the glass substrate for evaluation are connected by using them. Herein, a connection body in which the IC chip for evaluation is connected to the glass substrate for evaluation through the temporary fixing step and the final compression bonding step, and a connection body in which the IC chip for evaluation is connected to the glass substrate for evaluation are connected only in the final compression bonding step are prepared, and the number of trapped conductive particles in the bump of each of the IC chip for evaluation is determined. The number of conductive particles trapped in the bump was determined by counting the number of conductive particles deformed by the pressure of the bump appearing on the back surface of the glass substrate. According to this, evaluation was performed by determining the particle (filler) trapping efficiency based on the number density of the conductive particles before the connection and the bump area. Here, the particle trapping efficiency is a ratio of the number density of the conductive particles trapped on the bump (terminal) to the number density of the conductive particles in the anisotropic conductive film before connection, and is calculated by the following equation.

particle trapping efficiency (%)=[{number of conductive particles trapped in one terminal (number of particles)/effective connection area for one terminal ($\mu m^2 * 10^{-6}$)}/number density of anisotropic conductive film before connection (number of particles/$mm^2$)]*100(%)

Anisotropic Conductive Film

As for the anisotropic conductive film used in the present examples, the conductive particle-aligned layer 13 was prepared by the blending ratio shown in Table 1. Then, the resin composition forming the conductive particle-aligned layer 13 was applied onto a PET film having a film thickness of 50 μm by a bar coater, and dried in an oven at 80° C. for 5 minutes to form the binder resin layer 11 on the PET film. Similarly, the insulating adhesive layer 14 was prepared with the following blending ratio and formed on a PET film.

TABLE 1

|  |  |  | conductive particle-aligned layer | insulating adhesive layer |
| --- | --- | --- | --- | --- |
| Phenoxy resin | Nippon Steel & Sumikin Chemical | YP-50 | 22 | 30 |
| Silica filler | Japan Aerosil | Aerosil R805 | 33 | 5 |
| Liquid epoxy | Mitsubishi Chemical | jER828 | 40 | 60 |
| Silane coupling agent | Shin-Etsu Chemical | KBM-403 | 2 | 2 |
| Thermal cationic polymerization initiator | Sanshin Chemical Industry | SI-60L | 3 | 3 |

(parts by mass)

Further, a mold was fabricated so that the conductive particles 12 are aligned in a hexagonal lattice in plan view, as shown in FIG. 1, the distance between the particles is equal to the particle diameter (3 μm) of the conductive particles, and the number density of the conductive particles 12 is 28,000 particles/$mm^2$.

As the conductive particles, metal coated resin particles (Sekisui Chemical, AUL 703, average particle size 3 μm) were prepared, the conductive particles were filled in the recesses of the resin mold, the binder resin layer 11 was disposed thereon, and adhered by pressing at 60° C. and 0.5 MPa. Then, the binder resin layer 11 was peeled from the mold, and the conductive particles on the binder resin layer 11 were pressed into the binder resin layer 11 by pressurization (pressing conditions: 60 to 70° C., 0.5 MPa), thereby producing the conductive particle-aligned layer 13.

In addition, a two-layer type anisotropic conductive film was produced by laminating the insulating adhesive layer 14 on the conductive particle-aligned layer 13.

Film Surface Adhesiveness (1) Temporary Pasting Test

The surface into which the conductive particles are pushed and opposite side surface of anisotropic conductive films prepared in Example 1 and Comparative Examples 1 to 4 described below were temporary pasted to a non-alkali glass plate for evaluation, by using a buffer material (polytetrafluoroethylene) having a thickness of 50 μm and an anisotropic conductive film having a width of 1.5 mm and a length of 50 mm, under a compression-bonding temperature of 70° C., a compression-bonding pressure of 1 MPa, and a compression-bonding time of 1 second. By peeling off the PET film provided on the side opposite to the pasted surface with the tweezers, whether or not the anisotropic conductive film was peeled off from the glass substrate together with the PET film was observed. This test was repeated 100 times and evaluated using the following criteria, and the evaluation results are shown in Table 2.

Evaluation Criteria

OK: The anisotropic conductive film was not peeled off from the glass substrate in all 100 tests.

NG: The anisotropic conductive film was peeled off from the glass substrate at least once out of 100 tests.

When the anisotropic conductive films of Example 1 and Comparative Examples 1 to 4 were placed on a flat surface and felt with a finger, the adhesive force on the insulating adhesive layer 14 side was larger than the adhesive force on the conductive particle-aligned layer 13 side.

(2) Adhesive Strength (Adhesive Force 1)

Figure 6:
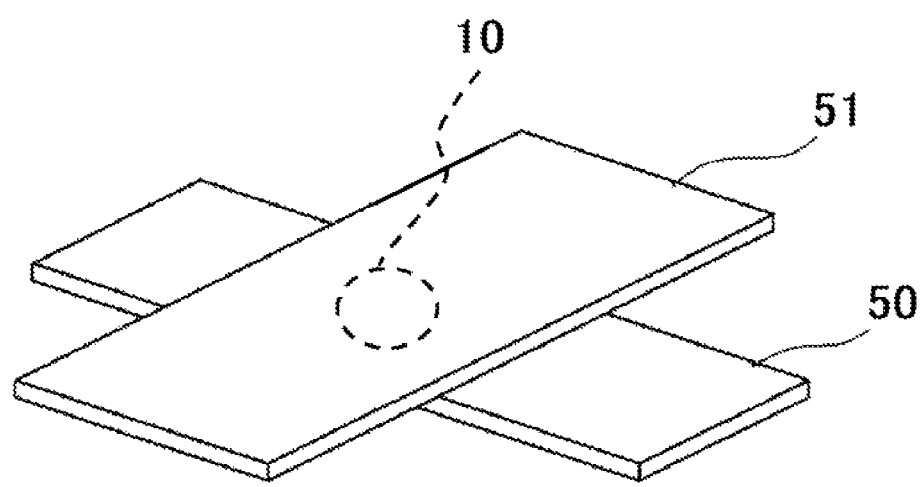
FIG. 6 is a perspective view of a sample of an adhesive strength test.

In accordance with the adhesive strength test described in Japanese Unexamined Patent Application Publication No. 2017-48358, as shown in FIG. 6, two slide glasses (26 mm×76 mm×1 mm) 50 and 51 (available from Matsunami Glass Ind., Ltd.) were stacked so that one rotates 90 degree, and each anisotropic conductive film 10 produced in Example 1 and Comparative Examples 1 to 4 was sandwiched therebetween. In this case, in the film structure shown in FIG. 3, each anisotropic conductive film 10 was formed by punching out into a circular shape (10 mm diameter), and the surface on the side of the conductive particle-aligned layer 13 was superposed on the lower slide glass 50. Then, the lower slide glass 50 was placed on a hot plate heated to 40 to 50° C. which is a general stage temperature for temporary pasting at the time of mounting, and pressed by a finger and heated for 30 seconds to be bonded, and the lower slide glass 50 and the lower surface of the anisotropic conductive film 10 were brought into a so-called temporary pasting state. Subsequently, the upper slide glass 51 was placed on the insulating resin layer 14 surface of each anisotropic conductive film 10 and pasted thereto. Since the measurement is conducted in a state in which the anisotropic conductive film 10 is pasted to the lower slide glass 50, what is measured is the adhesive force between the insulating resin layer 14 surface of the anisotropic conductive film 10 and the upper slide glass 51.

Figure 7:
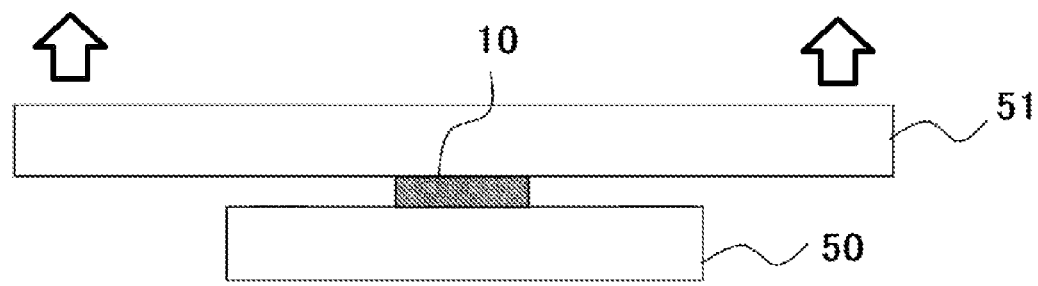
FIG. 7 is an explanatory view of the adhesive strength test method.

Using the AGS-X series available from Shimadzu Corporation, the lower slide glass 50 was fixed by a jig, both ends of the upper slide glass 51 were pulled up by the jig in the vertical direction as shown in FIG. 7 at 10 mm/min at a temperature of 50° C., the force when the lower slide glass 50 and the upper slide glass 51 were separated was measured, and the measured value was divided by the area of the anisotropic conductive film 10 to determine the adhesive strength (adhesive force 1) of the surface on the side of the insulating adhesive layer 14. In Example 1 and Comparative Examples 1 to 4, the adhesive strength (adhesive force 1) was determined twice, and the lowest values thereof are shown in Table 2.

(3) Tack Force (Adhesive Force 2) Measured by Probe Method

Using a tack tester (TACII available from RHESCA), tack force was measured under an atmosphere of 22° C. as follows. First, the anisotropic conductive films 10 (1 cm×1 cm) prepared in Example 1 and Comparative Examples 1 to 4 were pasted to a plain glass plate (0.3 mm thickness). In this case, in the film configuration shown in FIG. 3, the lower surface was pasted to the plain glass plate, the upper surface was used as a tack force measuring surface, and the plain glass plate was placed on a receiving base of silicon rubber of the sample base. Next, cylindrical probe (mirror finished stainless steel) having a diameter of 5 mm of the tack tester a was set above the measurement surface, the probe was brought into contact with the measurement surface at a pressing speed of 30 mm/min, pressed at a pressing pressure of 196.25 gf for 1.0 seconds, peeled off from the measurement surface by 2 mm at a peeling speed of 120 mm/min, and then the resistance that the probe receives during the peeling off due to the adhesive force of the measurement surface was measured as the load value, and the maximum load when the probe was peeled off from the measurement surface was defined as the tack force. The tack force was measured twice in each of Examples and Comparative Examples, and the lowest values were shown in Table 2.

TABLE 2

| | Ex. 1 (aligned) | Comp. 1 (dispersed) | Comp. 2 (aligned) | Comp. 3 (aligned) | Comp. 4 (dispersed) |
|---|---|---|---|---|---|
| Temporary compression bonding test | OK | OK | OK | OK | OK |
| Adhesive strength (adhesive force 1) (N/cm$^2$) | 20.8 | 17.9 | 20.8 | 20.8 | 17.9 |
| Tack force (adhesive force 2) (kPa) | 9.3 | 3.2 | 9.3 | 9.3 | 3.2 |

IC Chip for Evaluation/Glass Substrate for Evaluation

The configuration of the IC chip for evaluation used in these examples is as follows. Peripheral IC chip: external dimensions of 6×6 mm, bump specifications: φ 36 μm (circular bump), bump pitch of 300 μm, bump height of 20 μm. The connecting area where the conductive particles could be sandwiched between the bump and the terminal was about 1,000 μm$^2$.

As the substrate for evaluation used in these examples, a plain glass plate having outer dimensions of 15×15 mm and a thickness of 150 μm was used.

Upon connecting the IC chip and the glass substrate for evaluation, the longitudinal direction of the anisotropic conductive film and the alignment direction of the bump were aligned. The bonder used for the connection was a flip chip bonder (FCB3, available from Panasonic) having a pulse heater, with temperature rise of 0.5 seconds and pressure rise of 0.5 seconds for both temporary compression bonding and final compression bonding.

Example 1

In Example 1, a two-layer type anisotropic conductive film composed of a conductive particle-aligned layer (thickness: 4 μm) and an insulating adhesive layer (thickness: 14 μm) prepared by the above-described blending ratio was used. The minimum melt viscosity of the conductive particle-aligned layer according to Example 1 was three times or more that of the insulating adhesive layer (measured with a rotating rheometer (available from TA instrument), under the conditions of measuring pressure of 5 g, temperature range of 30 to 200° C., temperature rising rate of 10° C./min, measuring frequency of 10 Hz, measuring plate diameter of 8 mm, and load fluctuation of 5 g with respect to the measuring plate). Further, in Example 1, an aligned type anisotropic conductive film in which, as the conductive particles, metal coated resin particles (Sekisui Chemical, AUL 703, average particle size: 3 μm, particle area S 1: 7.065 μm$^2$) are regularly aligned in a hexagonal lattice pattern in a binder resin layer was used. The particle number density was 28,000/mm$^2$.

In Example 1, the connection body was manufactured through a temporary fixing step and a final compression bonding step which is performed after the temporary fixing step. The pressing conditions of the temporary fixing step are 80° C., 77 MPa, and 3 seconds. The final compression bonding step was performed under the conditions of 180° C., 144 MPa, and 10 seconds without releasing the pressing force in the temporary fixing step.

The particle trapping efficiency was determined by measuring the number of conductive particles sandwiched (deformed) between the bump and the plain glass plate and using the following equation. The particles were observed from the plain glass plate side using a metal microscope and measured.

particle trapping efficiency (%)=[{number of conductive particles trapped in one terminal (number of particles)/effective connection area for one terminal (μm$^2$*10$^{-6}$)}/number density of anisotropic conductive film before connection (number of particles/mm$^2$)]*100(%)

In the connection body according to Example 1, the particle trapping efficiency was 52.1%.

Comparative Example 1

In Comparative Example 1, a two-layer type anisotropic conductive film composed of a conductive particle-containing layer (thickness: 6 μm) and an insulating adhesive layer (thickness: 12 μm) prepared by the above-described blending ratio was used. Further, in Comparative Example 1, a dispersed type anisotropic conductive film in which, as the conductive particles, metal coated resin particles (Sekisui Chemical, AUL 703, average particle size: 3 μm, particle area Si: 7.065 μm$^2$) were dispersed in a binder resin layer was used. The particle number density was 60,000/mm$^2$.

In Comparative Example 1, a connection body was manufactured through a temporary fixing step and a final compression bonding step which was performed after the temporary fixing step. The pressing conditions of the temporary fixing step and the final compression bonding step are the same as those of Example 1.

In the connection body according to Comparative Example 1, the particle trapping efficiency was 21.7%.

Comparative Example 2

In Comparative Example 2, an anisotropic conductive film of the same aligned type as in Example 1 was used.

In Comparative Example 2, the connection body was manufactured through only the final compression bonding step without performing the temporary fixing step. The pressing conditions in the final compression bonding step are the same as those in Example 1.

In the connection body according to Comparative Example 2, it was determined that the connection itself was not made because the deformed conductive particles were not observed.

Comparative Example 3

In Comparative Example 3, an anisotropic conductive film of the same aligned type as in Example 1 was used.

In Comparative Example 3, the connection body was manufactured through only the final compression bonding step without performing the temporary fixing step. The final compression bonding step was carried out under the same conditions except that the pressure in the final compression bonding step of Example 1 was increased by 50 times.

In the connection body according to Comparative Example 3, the particle trapping efficiency was 45.4%.

Comparative Example 4

In Comparative Example 4, the same dispersed type anisotropic conductive film as in Comparative Example 1 was used.

In Comparative Example 4, the connection body was manufactured through only the final compression bonding step without performing the temporary fixing step. The pressing conditions in the final compression bonding step are the same as those in Example 1.

In the connection body according to Comparative Example 4, the particle trapping efficiency was 28.2%.

When the anisotropic conductive films of Example 1 and Comparative Examples 1 to 4 were placed on a flat surface and felt with a finger, the adhesive force on the side of the low-viscosity resin layer was larger than that on the side of the high-viscosity resin layer.

firmed by setting the pressing force to 50 times that of Comparative Example 2 (Example 1). It is inferred that a large amount of pressure was required to deform the particles because the resin was cured before the flow of the resin occurred. It should be noted that, by increasing pressurizing force like this, the electronic component is greatly affected by heat and pressure, and there is a concern about damage.

Herein, the thickness ratio of the conductive particle-aligned layer/conductive particle containing layer having high viscosity (4 µm of aligned type and 6 µm of dispersed type) and the insulating resin layer having low viscosity is different between the dispersed type and the aligned type. The total thickness of the film is thinner than the bump height. Therefore, the evaluation is performed in a state where the filling of the resin between the bumps is insufficient. Comparative examples 2, 3, and 4 which do not include the temporary fixing step are affected by this insufficiency. It is inferred that this is the reason why the pressure in Comparative Example 3 must be significantly higher than that in Comparative Example 2. It is inferred that the entire film is unlikely to be filled with resin between the bumps when pressed since the thickness of the high-viscosity conductive particle-containing layer is 1.5 times the thickness of the conductive particle-aligned layer. This can also be seen from the fact that the trapping efficiency of Com-

TABLE 3

| | | Ex. 1 | Comp. 1 | Comp. 2 | Comp. 3 | Comp. 4 |
|---|---|---|---|---|---|---|
| conductive particles (diameter: 3 µm) | aligned/dispersed | aligned | dispersed | aligned | aligned | dispersed |
| | particle number density (particles/mm$^2$) | 28000 | 60000 | 28000 | 28000 | 60000 |
| temporary fixing step | | performed | performed | not | not | not |
| particle trapping efficiency (%) | | 52.1 | 21.7 | — | 45.4 | 28.2 |

As shown in Table 3, by using an aligned type anisotropic conductive film, the connection body connected through the temporary fixing step and the final compression bonding step was able to trap the particles best. On the contrary, although Comparative Example 1 using a dispersed type anisotropic conductive film was connected through a temporary fixing step and a final compression bonding step under the same conditions as in Example 1, the particle trapping efficiency was inferior to that of Example 1. It can be seen from this that the use of the anisotropic conductive film of the aligned type improves the particle trapping properties.

In Comparative Example 2, which was not subjected to the temporary fixing step, although an aligned type anisotropic conductive film was used, the connection was made only in the final compression bonding step; therefore, although the same final compression bonding conditions as in Example 1 were used to press the particles into the resin, the deformation of the particles were not observed, and according to which, it was determined that the particles were not trapped (not sandwiched therebetween) and the connection was not made. It is presumed that this is because, when the connection is made only by the final compression bonding step, the high heat of the compression bonding tool heats the binder resin before the conductive particles are deformed sufficiently, so that the flow is not promoted and the particles are cured in a state of insufficient pushing.

Further, in Comparative Example 3, when the connection was made only by the final compression bonding step as in Comparative Example 2, deformation of particles was conparative Example 4 is higher than that of Comparative Example 1. In spite of this, it can be said that the temporary fixing step of particles is more effective in the particle-aligned type since the trapping efficiency of Example 1 is higher than those of Comparative Examples 1 and 4.

Comparative Example 4, which uses a dispersed type anisotropic conductive film and is connected only by the final compression bonding step, has a higher particle trapping efficiency than Comparative Example 1, which performs the temporary fixing step. It is presumed that this is a result of the fact that variation of the number of particles that can be trapped by the terminal in the state before connection is larger in the dispersed type than in the aligned type. That is, it is inferred that even if the temporary fixing step is performed to stabilize the particle trapping efficiency, the aligned type is more effective than the dispersed type.

From the above, it can be seen that in the connection of the electronic component in which the bump area is minimized, the conductive particles can be reliably sandwiched by using an aligned type anisotropic conductive film and performing the temporary fixing step and the final compression bonding step for connection. This is because, by performing the final compression bonding step without releasing the pressurizing force in the temporary fixing step, the conductive particles can be sandwiched between the bump and the terminal electrode while minimizing the flow of the conductive particles, so that the conductive particles are trapped by the bump in a state of maintaining the arrangement pattern close to the initial arrangement. Further, by providing the temporary fixing step, it is not necessary to increase the pressure to a great extent as compared with the case where the connection is performed only by the final compression bonding step, and it is possible to secure excellent particle trapping properties while suppressing damage to the electronic component. Therefore, with the method for manufacturing a connection body according to the present technology, even when the bump area is minimized, an appropriate trapping state of the conductive particles can be ensured.

These examples uses the anisotropic conductive film and a member or apparatus suitable for the anisotropic conductive film and verifies that a particle-aligned type connection film (filler-containing film) can obtain a higher trapping property (alignment maintainability) by the temporary fixing step, and according to which, it is inferred that the present technology can trap the particles while maintaining the arrangement pattern close to the initial arrangement.

As explained in the present examples of the anisotropic conductive connecting method and the connection body, for the filler-containing film in which fillers are aligned in a resin, providing the temporary fixing step is effective in order to obtain an accurate sandwiching state without impairing the arrangement of fillers (particles). In particular, it can be inferred that a film in which fillers are aligned and the arrangement (alignment) is maintained has an industrial applicability different from the film in which fillers are dispersed. This is because, although it takes time and effort for observation and measurement just to grasp the state before and after connection, it can be easily guessed that this observation and measurement will be easier when the fillers are aligned compared to when the filler is dispersed.

The preferred embodiments of the present technology have been described in detail, but the present technology is not limited to these embodiments. It is clear that a person having ordinary skill in the art to which the present technology belongs may conceive of various alternatives or modifications without departing from the scope of the technical ideas described in the claims, and these are also naturally understood to fall within the technical scope of the present technology.

DESCRIPTION OF REFERENCE CHARACTERS

1 filler-containing film, 2 filler, 3 filler-aligned layer, 10 anisotropic conductive film, 11 binder resin layer, 12 conductive particles, 13 conductive particle-aligned layer, 14 insulating adhesive layer, 20 first electronic component, 21 bump, 30 second electronic component, 31 terminal electrode, 40 connection body

What is claimed is:

1. A method for manufacturing a connection body comprising:
    a disposing step of disposing a filler-containing film having a filler-aligned layer in which individual independent fillers are aligned in a binder resin layer between a first component having a first connection portion and a second component having a second connection portion;
    a temporary fixing step of applying pressure to the first component or the second component to sandwich the filler-aligned layer between the first connection portion and the second connection portion; and
    a final compression bonding step of further pressing the first component or the second component after the temporary fixing step to sandwich the filler between the first connection portion and the second connection portion,
    wherein the pressure applied in the temporary fixing step is not released, and the pressure of a compression bonding tool is further increased to pressurize the first electronic component and the second electronic component.

2. The method for manufacturing a connection body according to claim 1, wherein the first connection portion is a first electrode terminal, and the second connection portion is a second electrode terminal, and
    wherein the filler is conductive particles.

3. The method according to claim 2, wherein the filler-containing film has an insulating adhesive layer containing no conductive filler.

4. The method according to claim 3, wherein the disposing step is performed by disposing the filler-aligned layer on the first electrode terminal or the second electrode terminal, and
    wherein the temporary fixing step is performed by pressing from the insulating adhesive layer side.

5. The method according to claim 3, wherein the insulating adhesive layer is a resin layer having a lower viscosity than the filler-aligned layer.

6. The method according to claim 5, wherein the total thickness of the resin layer in the filler-containing film is 0.6 times or more and 50 times or less the particle diameter of the filler.

7. The method according to claim 2, wherein the first electrode terminal is a bump provided on the first component,
    and the total thickness of the filler-containing film is thinner than the height of the first electrode terminal.

8. The method according to claim 1, wherein the filler-aligned layer has a thickness of not more than two times the average particle diameter of the filler.

9. The method according to claim 1, wherein the heating temperature and pressure at the time of the temporary fixing step are such that conductive particles are held without flowing out from between the bump and the terminal electrode while the adhesive component of an anisotropic conductive film as the filler-containing film flows, and are equal to or lower than the heating temperature and pressure in the subsequent final compression bonding, respectively.

10. The method according to claim 9, wherein the temporary fixing step sandwiches the conductive particle-aligned layer between the bump and the terminal electrode.

11. The method according to claim 9, wherein in the temporary fixing step, the bump comes into contact with the conductive particles.

12. The method according to claim 1, wherein conductive particles are arranged in a regular manner repeating a predetermined alignment in plan view of the film.

13. The method according to claim 1, wherein the thickness of the filler-containing film is 0.3 times or more and 20 times or less of the particle diameter of the filler.

14. The method according to claim 1, wherein according to an adhesive strength test for measuring adhesive force, by sandwiching an anisotropic conductive film as the filler-containing film between two glass plates, fixing one glass plate, reinforcing the adhesive state between the fixed glass plate and the anisotropic conductive film, and peeling off the other glass plate at a peeling-off speed of 10 mm/min and a test temperature of 50° C., the adhesive force between the peeled-off glass plate and the surface of the anisotropic conductive film bonded to the glass plate is measured and is 1 N/cm$^2$ or more.

15. The method according to claim 1, wherein adhesive force of an anisotropic conductive film as the filler-containing film is measured as a tack force measured by a probe method on at least one of the front and back surfaces of the anisotropic conductive film is set to 10 kPa or more, as measured at a probe pressing speed of 30 mm/min, a pressing pressure of 196.25 gf, a pressing time of 1.0 sec, a peeling speed of 120 mm/min, and a measuring temperature of 23±5° C., in the measurement, the tack force of one surface of the anisotropic conductive film is measured by pasting the other surface to a plain glass plate.

16. A method for connecting a component comprising: a disposing step of disposing a filler-containing film having a filler-aligned layer in which individual independent fillers are aligned in a binder resin layer between a first component having a first connection portion and a second component having a second connection portion;
- a temporary fixing step of applying pressure to the first component or the second component to sandwich the filler-aligned layer between the first connection portion and the second connection portion; and
- a final compression bonding step of further pressing the first component or the second component after the temporary fixing step to sandwich the filler between the first connection portion and the second connection portion,
- wherein the pressure applied in the temporary fixing step is not released, and the pressure of a compression bonding tool is further increased to pressurize the first electronic component and the second electronic component.

* * * * *